(12) United States Patent
Gong et al.

(10) Patent No.: US 10,297,525 B2
(45) Date of Patent: May 21, 2019

(54) BASE PLATE FOR HEAT SINK AS WELL AS HEAT SINK AND IGBT MODULE HAVING THE SAME

(71) Applicant: BYD COMPANY LIMITED, Shenzhen, Guangdong (CN)

(72) Inventors: Qing Gong, Shenzhen (CN); Yaxuan Sun, Shenzhen (CN); Xinping Lin, Shenzhen (CN); Shuming Zhao, Shenzhen (CN); Bo Wu, Shenzhen (CN); Jingjing Luo, Shenzhen (CN); Donghai Cheng, Shenzhen (CN)

(73) Assignee: BYD COMPANY LIMITED (CN)

( * ) Notice: Subject to any disclaimer, the term of this patent is extended or adjusted under 35 U.S.C. 154(b) by 0 days.

(21) Appl. No.: 15/769,589

(22) PCT Filed: Oct. 28, 2016

(86) PCT No.: PCT/CN2016/103806
§ 371 (c)(1),
(2) Date: Apr. 19, 2018

(87) PCT Pub. No.: WO2017/071652
PCT Pub. Date: May 4, 2017

(65) Prior Publication Data
US 2018/0317342 A1    Nov. 1, 2018

(30) Foreign Application Priority Data

Oct. 30, 2015   (CN) ..................... 2015 2 0862189 U

(51) Int. Cl.
*H01L 23/36*     (2006.01)
*H01L 23/367*    (2006.01)
(Continued)

(52) U.S. Cl.
CPC ........ *H01L 23/3677* (2013.01); *H01L 23/473* (2013.01); *H05K 7/20254* (2013.01); *H01L 25/07* (2013.01); *H01L 29/7393* (2013.01)

(58) Field of Classification Search
CPC ....... H01L 23/3677; H01L 23/42–4735; H01L 29/66325–66348; H01L 29/7393–7398; H01L 29/083–0834; H01L 2924/13055
See application file for complete search history.

(56) References Cited

U.S. PATENT DOCUMENTS 5,673,177 A * 9/1997 Brodsky ............. H01L 23/3677
165/185
5,689,404 A * 11/1997 Katsui ................. H01L 23/3677
165/80.3
(Continued)

FOREIGN PATENT DOCUMENTS

| CN | 101796367 A | 8/2010 |
| CN | 104247009 A | 12/2014 |
| CN | 205213228 U | 5/2016 |

OTHER PUBLICATIONS

International Search Report From PCT/CN2016/103806 dated Feb. 6, 2017 (3 pages).

*Primary Examiner* — Scott B Geyer
(74) *Attorney, Agent, or Firm* — Calfee, Halter & Griswold LLP

(57) ABSTRACT

A base plate for a heat sink as well as a heat sink and an IGBT module having the same are provided. The base plate includes: a base plate body, including a body part; and a first surface layer and a second surface layer disposed respectively on two opposing surfaces of the body part; and N pins disposed on the first surface layer and spaced apart from one another, each pin having a first end fixed on the first surface layer and a second end configured as a free end, in which the first surface layer and the N pins are configured to contact a (Continued)

coolant, an area of a first portion of the first surface layer contacting the coolant is denoted as S1, and an area of a second portion of the first surface layer contacting each pin is denoted as S2, in which $180 \leq S1/S2 \leq 800$, and $300 \leq N < 650$.

19 Claims, 5 Drawing Sheets

(51) Int. Cl.
*H01L 23/473* (2006.01)
*H05K 7/20* (2006.01)
*H01L 25/07* (2006.01)
*H01L 29/739* (2006.01)

(56) References Cited

U.S. PATENT DOCUMENTS

| | | | |
|---|---|---|---|
| 5,778,970 A * | 7/1998 | Chang | H01L 23/367 165/185 |
| 5,829,514 A * | 11/1998 | Smith | F28F 3/022 165/78 |
| 5,886,870 A * | 3/1999 | Omori | H01L 23/32 165/185 |
| 2003/0221814 A1* | 12/2003 | Kamath | F28F 3/022 165/80.3 |
| 2004/0150956 A1* | 8/2004 | Conte | H01L 23/3677 361/709 |
| 2005/0039882 A1* | 2/2005 | Griesmayer | H01L 23/3677 165/80.3 |
| 2005/0143000 A1* | 6/2005 | Eisele | F28F 3/086 454/184 |
| 2006/0231236 A1 | 10/2006 | Spokoiny | |
| 2012/0250333 A1* | 10/2012 | Chou | F21V 29/004 362/351 |
| 2013/0285234 A1* | 10/2013 | Uhlemann | H01L 23/3677 257/712 |
| 2013/0306291 A1* | 11/2013 | Tung | H01L 23/3677 165/185 |
| 2014/0091453 A1* | 4/2014 | Mori | H01L 23/473 257/712 |
| 2014/0158324 A1* | 6/2014 | Tochiyama | H05K 7/20281 165/67 |
| 2015/0327394 A1* | 11/2015 | Davis | H01L 23/4006 361/720 |
| 2015/0338176 A1* | 11/2015 | Chen | F28F 21/084 165/185 |
| 2016/0029516 A1* | 1/2016 | Sever | F28F 3/022 165/80.3 |
| 2016/0190038 A1* | 6/2016 | Koyama | H05K 7/20927 257/693 |
| 2016/0341492 A1* | 11/2016 | Watanabe | H01L 23/3677 |
| 2017/0178996 A1* | 6/2017 | Wahl | H01L 23/3732 |
| 2017/0186663 A1* | 6/2017 | Laven | H01L 29/4236 |
| 2017/0278770 A1* | 9/2017 | Kato | H01L 25/07 |
| 2017/0280588 A1* | 9/2017 | Wu | H01L 23/3677 |
| 2017/0287809 A1* | 10/2017 | Schultz | H01L 23/3677 |
| 2018/0058773 A1* | 3/2018 | Adhiachari | F28F 3/022 |
| 2018/0087846 A1* | 3/2018 | Remsburg | H01L 21/4882 |

* cited by examiner

Maximum temperature test of IGBT module

BASE PLATE FOR HEAT SINK AS WELL AS HEAT SINK AND IGBT MODULE HAVING THE SAME

CROSS REFERENCE TO RELATED APPLICATION

The present application is based on International Application No. PCT/CN2016/103806, filed on Oct. 28, 2016, which claims the priority of Chinese Patent Application No. 201520862189.5, filed on Oct. 30, 2015, the entire contents of which are herein incorporated by reference.

TECHNICAL FIELD

The present invention relates generally to a field of heat dissipation, more particularly relates to a base plate for a heat sink as well as a heat sink and an IGBT module having the same.

BACKGROUND

The heat sink using liquid as coolant has a compact structure and is configured as a metal fin having a relatively thin plate or strip shape, or is configured as a pin-shaped structure. A fluid channel is arranged inside the heat sink, so as to allow a convective heat exchange to be generated between the fluid and a base plate of the heat sink, and thus the fluid can dissipate the thermal-power consumption generated by high-power electronic components disposed on a surface of the base plate.

In the related art, the base plate of the heat sink has a complicated structure, thus resulting in high technological requirements for processing the base plate. That is, the base plate is difficult to process, and a rate of qualified product is low, so that a cost of the heat sink is increased.

SUMMARY

The present invention aims to solve at least one of the technical problems existing in the prior art to some extent. Accordingly, embodiments of the present invention provide a base plate for a heat sink, which has a reasonable structure, such that not only can a heat dissipation ability thereof be ensured, but also a difficulty and a cost to produce the base plate are reduced.

Embodiments of the present invention also provide a heat sink.

Embodiments of the present invention further provide an IGBT module.

The base plate according to embodiments of the present invention comprises: a base plate body, comprising a body part; and a first surface layer and a second surface layer disposed respectively on two opposing surfaces of the body part, the second surface layer being configured to be mounted with an electrical component; and N pins disposed on the first surface layer and spaced apart from one another, each pin having a first end fixed on the first surface layer and a second end configured as a free end, in which the first surface layer and the N pins are configured to contact a coolant, an area of a first portion of the first surface layer contacting the coolant is denoted as S1, an area of a second portion of the first surface layer contacting each pin is denoted as S2, in which $180 \leq S1/S2 \leq 800$, and $300 \leq N < 650$.

With the base plate according to embodiments of the present invention, through reasonably designing a ratio of the area S1 of the first portion of the first surface layer contacting the coolant to the area S2 of the second portion of the first surface layer contacting each pin, the whole structure of the base plate is reasonable, and a heat-dissipating area enough large can be ensured. Moreover, through configuring the amount of the pins reasonably, a coolant flow resistance is reduced effectively, and a heat dissipation efficiency is improved. Furthermore, technological requirements of processing the base plate are reduced, and a difficult of demoulding the base plate is decreased, and a qualified-product rate of the base plate is enhanced, so that a producing difficulty and a producing cost of the base plate are reduced.

The heat sink according to embodiments of the present invention comprises the base plate mentioned above. Since the amount of pins of the base plate is designed reasonably, and the area S1 of the first portion of the first surface layer 11 contacting the coolant and the area S2 of the second portion of the first surface layer 11 contacting each pin 20 are designed reasonably, the coolant flow resistance is reduced effectively and the heat dissipation efficiency is improved, and meanwhile a sufficient heat-dissipating area is ensured. Furthermore, the technological requirement of processing the base plate 100 is reduced, the difficulty of demoulding the base plate is decreased, and the qualified-product rate of the base plate is enhanced, thus reducing the producing difficulty and the producing cost of the base plate.

The IGBT module according to embodiments of the present invention comprises the base plate mentioned above. Since the amount of pins of the base plate is designed reasonably, and the area S1 of the first portion of the first surface layer contacting the coolant and the area S2 of the second portion of the first surface layer contacting each pin are designed reasonably, the coolant flow resistance is reduced effectively, the heat dissipation efficiency is improved, and meanwhile the sufficient heat-dissipating area is ensured. Furthermore, the technological requirement of processing the base plate is reduced, the difficulty of demoulding the base plate is decreased, and the qualified-product rate of the base plate is improved, thus reducing the producing difficulty and the producing cost of the base plate.

Additional aspects and advantages of embodiments of present invention will be given in part in the following descriptions, become apparent in part from the following descriptions, or be learned from the practice of the embodiments of the present invention.

BRIEF DESCRIPTION OF THE DRAWINGS

The accompanying drawings are provided to facilitate further understanding of the present invention, constitute a part of the specification, and are used to interpret the present invention together with the following specific embodiments, but do not constitute a limitation to the present invention. In the accompanying drawings.

Figure 1:
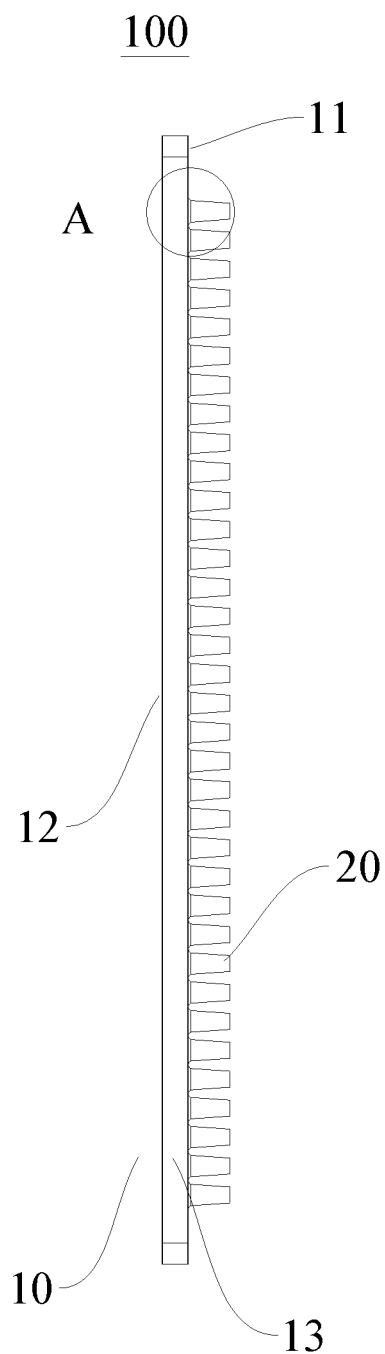
FIG. 1 is a side view of a base plate for a heat sink according to an embodiment of the present invention.

REFERENCE NUMERALS 100 base plate for heat sink;
10 base plate body, 11 first surface layer, 12 second surface layer, 13 body part;
20 pin, 21 free end, 22 fixed end;
30 cooling tank.

DETAILED DESCRIPTION

Reference will be made in detail to embodiments of the present invention. The embodiments described herein with reference to drawings are explanatory, illustrative, and used to generally understand the present invention. The embodiments shall not be construed to limit the present invention. The same or similar elements and the elements having same or similar functions are denoted by like reference numerals throughout the descriptions.

In the specification, unless specified or limited otherwise, relative terms such as "central", "longitudinal", "lateral", "front", "rear", "right", "left", "inner", "outer", "lower", "upper", "horizontal", "vertical", "above", "below", "up", "top", "bottom" as well as derivative thereof (e.g., "horizontally", "downwardly", "upwardly", etc.) should be construed to refer to the orientation as then described or as shown in the drawings under discussion. These relative terms are for convenience of description and do not require that the present invention be constructed or operated in a particular orientation.

In addition, terms such as "first" and "second" are used herein for purposes of description and are not intended to indicate or imply relative importance or significance. Thus, the feature defined with "first" and "second" may comprise one or more this feature. In the description of the present invention, "a plurality of" means two or more than two, unless specified otherwise.

In the description of the present invention, it should be understood that, unless specified or limited otherwise, the terms "mounted", "connected" and "coupled" and variations thereof are used broadly and encompass such as mechanical or electrical mountings, connections and couplings, also can be inner mountings, connections and couplings of two components, and further can be direct and indirect mountings, connections, and couplings, which can be understood by those skilled in the art according to the detail embodiment of the present invention.

A base plate 100 for a heat sink of the present invention will be described in detail with reference to drawings and in combination with embodiments.

Figure 2:
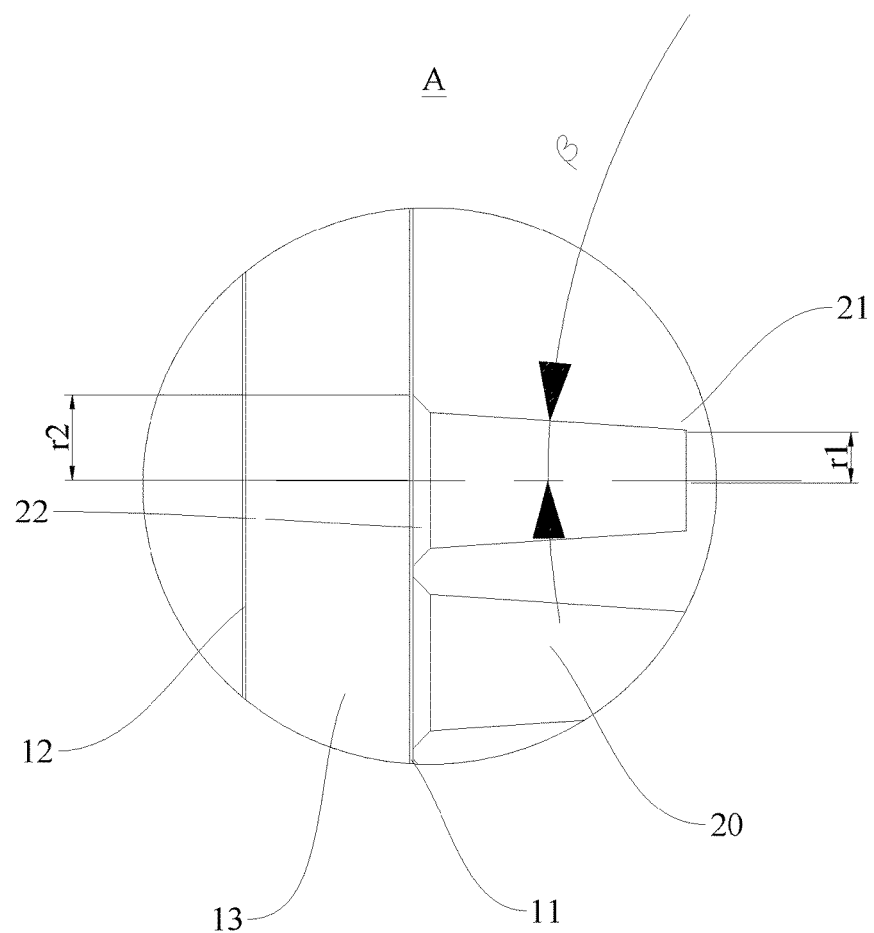
FIG. 2 is an enlarged view of part A in FIG. 1.
Figure 3:
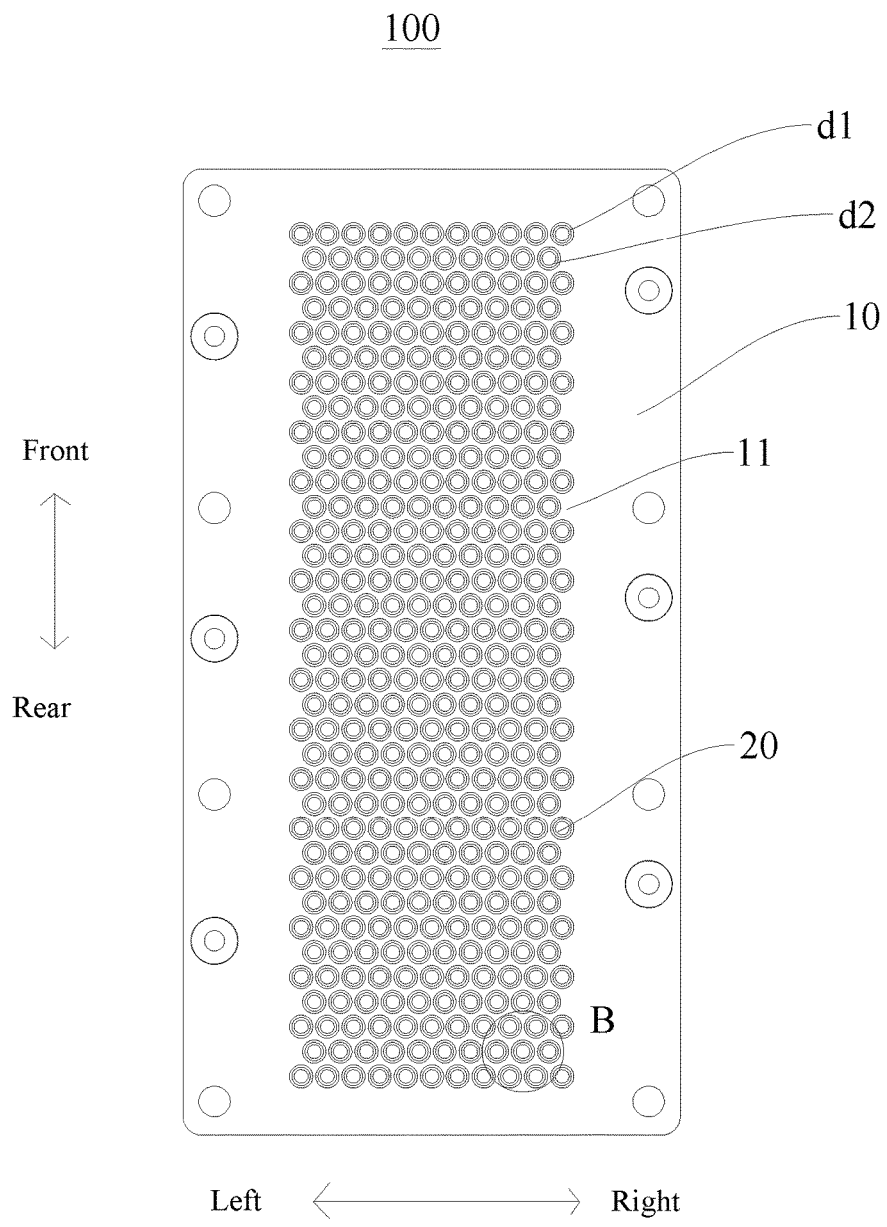
FIG. 3 is a bottom view of a base plate for a heat sink according to an embodiment of the present invention.

The base plate 100 according to embodiments of the present invention comprises a base plate body 10 and N pins 20. As shown in FIG. 1 to FIG. 3, the base plate body 10 comprises a body part 13, a first surface layer 11 and a second surface layer 12. The first surface layer 11 and the second surface layer 12 are disposed respectively on two opposing surfaces of the body part 13, that is the first surface layer 11 and the second surface layer 12 are disposed on the body part 13 and opposed to each other. The second surface layer 12 is configured to be mounted with an electrical component. Optionally, both the first surface layer 11 and the second surface layer 12 are aluminum layers or aluminum alloy layers. The N pins 20 are disposed on the first surface layer 11 and spaced apart from one another. A first end of each pin 20 is fixed on the first surface layer 11, and a second end of each pin 20 is configured as a free end 21. The first surface layer 11 and the N pins 20 both are configured to contact a coolant.

As shown in FIG. 2, the first end of the pin 20 is configured as a fixed end 22, and the fixed end 22 of each pin 20 is fixedly connected with the first surface layer 11. Thus, the coolant can be in contact with the first surface layer 11, and also can be in contact with an exposed surface of each pin 20. The heat generated by the electrical component disposed on the second surface layer 12 can be transmitted through the second surface layer 12 and the body part 13 to the first surface layer 11 and the N pins 20, so that the first surface layer 11 and the N pins 20 can further transmit the heat generated by the electrical component to the coolant, thus dissipating the heat generated by the electrical component and ensuring a working stability of the electrical component.

An area of a first portion of the first surface layer 11 contacting the coolant is denoted as S1, an area of a second portion of the first surface layer 11 contacting each pin is denoted as S2, and $180 \leq S1/S2 \leq 800$. It can be understood that, the base plate 100 satisfying the above formula can make the area S1 of the first portion of the first surface layer 11 contacting the coolant designed reasonably, and can also make the area S2 of the second portion of the first surface layer 11 contacting each pin 20 designed reasonably, so that the first surface layer 11 and the N pins 20 respectively can exchange heat with the coolant stably and reliably. Thus, a coolant flow resistance can be reduced effectively and a heat dissipation efficiency can be improved, while ensuring a sufficient heat-dissipating area. In some embodiments, $200 \leq S1/S2 \leq 500$.

An amount of the pins 20 satisfies a formula: $300 \leq N < 650$. Thus, under a condition of ensuring a reliable heat exchange between the pins 20 and the coolant, the amount of the pins 20 is reduced effectively, so that a technological requirement of processing the base plate 100 is reduced, the difficulty of demoulding the base plate 100 is also decreased, and the qualified-product rate of the base plate 100 is improved, thus reducing the producing difficulty and the producing cost of the base plate 100. In some embodiments, $300 \leq N < 420$.

Thus, with the base plate 100 according to embodiments of the present invention, through reasonably designing the area S1 of the first portion of the first surface layer 11 contacting the coolant and the area S2 of the second portion of the first surface layer 11 contacting each pin 20, the structure of the base plate 100 is reasonable, and the heat-dissipating area large enough can be ensured. Also, through designing the amount of the pins 20 reasonably, so as to reduce the coolant flow resistance effectively and improve the heat dissipation efficiency greatly, the technological requirement of processing the base plate 100 is reduced, the difficulty of demoulding the base plate 100 is decreased, and the qualified-product rate of the base plate 100 is improved, thus reducing the producing difficulty and the producing cost of the base plate 100.

According to an embodiment of present invention, a heat-dissipating area of the base plate 100 is denoted as S, a total area of outer surfaces of circumferential walls of the N pins 20 is denoted as S3, and a total area of end surfaces of the free ends 21 of the N pins 20 is denoted as S4, in which $S=S1+S3+S4$, and $40000 \text{ mm}^2 \leq S \leq 50000 \text{ mm}^2$. Thus, through configuring the heat-dissipating area S of the base plate 100 reasonably, a volume of the base plate 100 can be configured reasonably, and the heat exchange effect of the first surface layer 11 and the coolant as well as the heat exchange effect of the N pins 20 and the coolant can be ensured respectively, so that the base plate 100 has a great heat dissipation ability and a reasonable heat-dissipating area, and thus the heat dissipation effect of the heat sink is ensured effectively.

In some embodiments of the present invention, as shown in FIG. 2, from the first end (i.e. the fixed end 22) of the pin 20 to the second end (i.e. the free end 21) of the pin 20, a cross sectional area of the pin 20 decreases gradually. Through designing sizes of the fixed end 22 and the free end 21 of each pin 20 reasonably, each pin 20 has a reliable structure and can be stably connected with the first surface layer 11, and it is conducive to the heat exchange between the pin 20 and the coolant.

Figure 6:
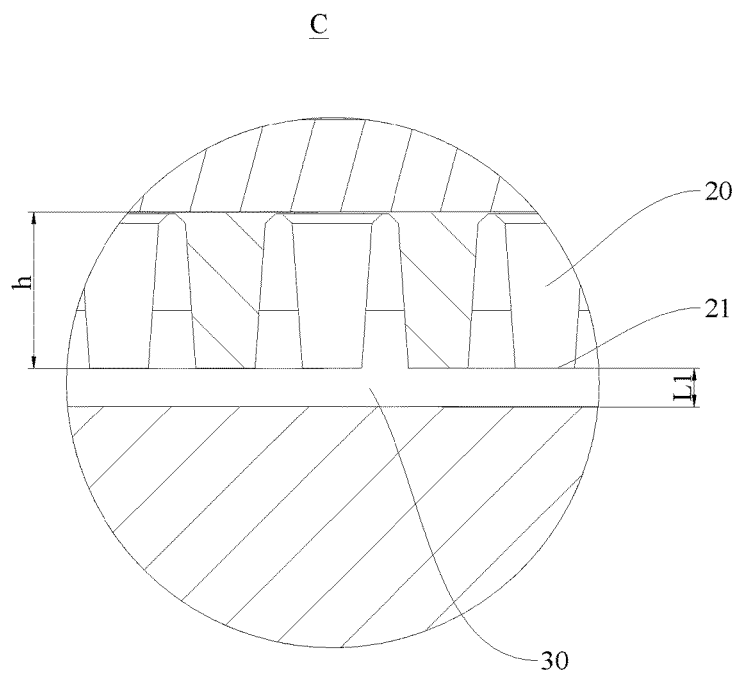
FIG. 6 is an enlarged view of part C in FIG. 5.

Optionally, as shown in FIG. 6, a height of the pin 20 is denoted as h, and 7.5 mm≤h<8.2 mm. In some embodiments, h=8 mm. Through configuring the height of the pin 20 reasonably, it is convenient for the pin 20 to be arranged in the cooling tank 30, thus ensuring the heat dissipation effect of the pin 20.

Optionally, a heat-dissipating area of each pin 20 is denoted as $(S3+S4)/N$, and $80 \leq (S3+S4)/N \leq 120$.

It should be understood that a specific shape of the pin 20 is not limited herein. According to an embodiment of the present invention, the pin 20 may be configured to have a cone shape, and a cross section of the pin 20 is circular. A ratio of a radius of the first end (i.e., the fixed end 22) of the pin 20 to a radius of the second end (i.e., the free end 21) of the pin 20 is denoted as α, and $1.2 \leq \alpha \leq 1.8$. As shown in FIG. 2, the radius of the free end 21 of the pin 20 is denoted as r1, the radius of the fixed end 22 of the pin 20 is denoted as r2, and α=r2/r1. The structure of the pin 20 satisfying the above formula is reliable, and an area of a portion of the pin 20 contacting the coolant is large, such that it is convenient for the heat exchange between the pin 20 and the coolant, thus fully ensuring the heat dissipation effect of the heat sink. In some embodiments, α=1.69.

Figure 5:
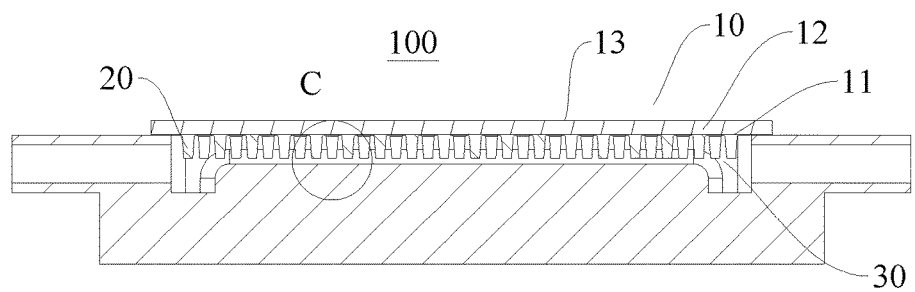
FIG. 5 is a sectional view of a base plate for a heat sink according to an embodiment of the present invention, in which the base plate is disposed in a cooling tank.

In some embodiments of the present invention, as shown in FIG. 5 to FIG. 6, the coolant is contained in a cooling tank 30, and the cooling tank 30 is configured to contact the first surface layer 11. That is, the cooling tank 30 is covered by the first surface layer 11 so as to place the N pins 20 in the cooling tank 30. The minimum distance from the free ends 21 of the N pins 20 to a bottom wall of the cooling tank 30 is denoted as L1, and 0.2 mm≤L1≤2 mm. It can be understood that, the height of the pin 20 is limited by a depth of the cooling tank 30, and thus the depth of the cooling tank 30 may be designed reasonably so as to make the height of the pin 20 reasonable. The interference generated by the cooling tank 30 to the pins 20 can be reduced if the cooling tank 30 and the pins 20 satisfy the above formula, and thus the normal operation of the pins 20 can be ensured.

Figure 4:
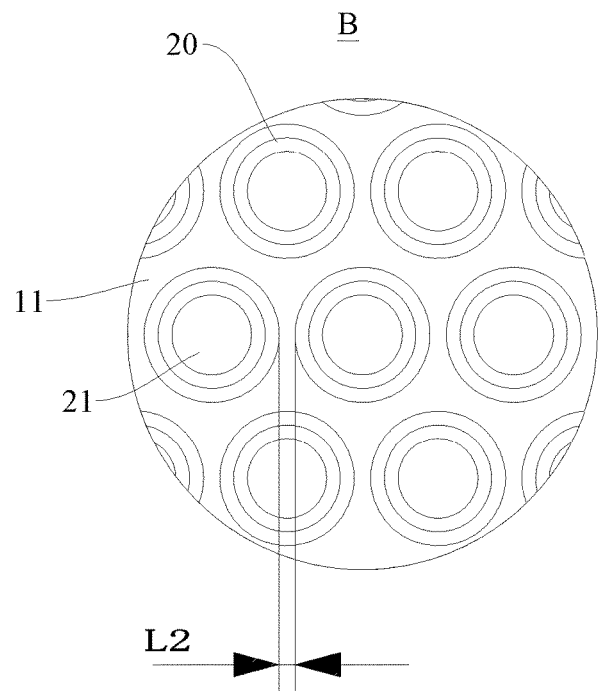
FIG. 4 is an enlarged view of part B in FIG. 3.

In an optional embodiment of the present invention, as shown in FIG. 4, a distance between two adjacent pins 20 is denoted as L2, and 0.4 mm≤L2≤1.1 mm. The distance L2 between two adjacent pins 20, satisfying the above formula, allows the N pins 20 to be arranged reasonably on the first surface layer 11, and also reduces the interference between two adjacent pins 20 at least to some extent, so that the normal heat exchange between each pin 20 and the coolant can be ensured, and thus the normal operation of the base plate 100 can be ensured.

Optionally, any two adjacent pins 20 form a group, and the distance L2 in a group of pins 20 may be different from the distance L2 in another group of pins 20. Thus, it is to be understood that, the distance L2 between two adjacent pins 20 can be adjusted according to an actual production situation, so that the difficulty of producing the base plate 100 can be reduced at least to some extent. For example, the distance L2 between two adjacent pins 20 arranged near a corner of the first surface layer 11 can be adjusted according to the actual production situation.

A specific arrangement of the N pins 20 of the base plate 100 will be provided in the following, but not limited to this. Specifically, N=368, the distance L2 in a first group of pins is 0.62 mm, the distance L2 in a second group of pins is 1.04 mm, and the distances L2 in rest groups of pins meet a following condition: 0.62 mm≤L2≤1.04 mm. It can be understood that, the distance L2 between two adjacent pins 20 has a minimum value of 0.62 mm and a maximum value of 1.04 mm. Thus, the pins 20 are reasonably arranged, easy to demould, and have the high rate of qualified products.

Optionally, a draft angle β of each pin 20 may range from 2° to 4°. The draft angle β of one pin 20 may be different from or same with the draft angle β of another pin 20. The pin 20 whose draft angle β meets the above range can reduce the difficulty of demoulding the base plate 100 at least to some extent, and thus can improve the qualified-product rate of the base plate 100.

Specifically, the heat dissipation effect of the pin 20 whose draft angle β is 2° is slightly better than the heat dissipation effect of the pin 20 whose draft angle β is 4°, but not by an obvious increase. However, increasing the draft angle β is good for demoulding, and a pressure difference between an inlet and an outlet of the cooling tank 30 can be ensured to the minimum, so the draft angle β of the pin 20 can be determined by technological difficulties and actual requirements.

In some embodiments, the body part 13, the first surface layer 11, the second surface layer 12 and the pins 20 may be molded integrally through a pressure infiltration die-casting. Thus, the base plate 100 which is molded integrally has a high structural strength, a long service life, and a simple manufacturing process.

Optionally, the body part 13 may be made of AlSiC composite materials in which a volume fraction of SiC is 60%-70%. The volume fraction refers to a ratio of a volume of SiC to a volume of AlSiC. It can be understood that, the body part 13 made of materials having the above ratio has a reliable structure and a good ability of heat exchange, such that the heat dissipation efficiency is ensured, and meanwhile the manufacturing cost is reduced. Optionally, the pins 20 may be made of aluminum or aluminum alloy, and the first surface layer 11 and the second surface layer 12 both may be aluminum layers or aluminum alloy layers. Thus, it is convenient for the heat exchange between the electrical component and the second surface layer 12, and it is also convenient for the first surface layer 11 and the pins 20 to exchange heat with the coolant. Furthermore, the manufacturing cost is reduced. In some embodiments, the body part 13 may be made of AlSiC composite materials in which the volume fraction of SiC is 65%.

A group of parameters of the base plate 100 according to embodiments of the present invention will be provided in the following, but should not be construed to limit the present invention. For example, 40000 mm²≤S≤50000 mm², N=368, S1/S2=229.284, h=8 mm, α=1.69, L1=0.4 mm.

Figure 7:
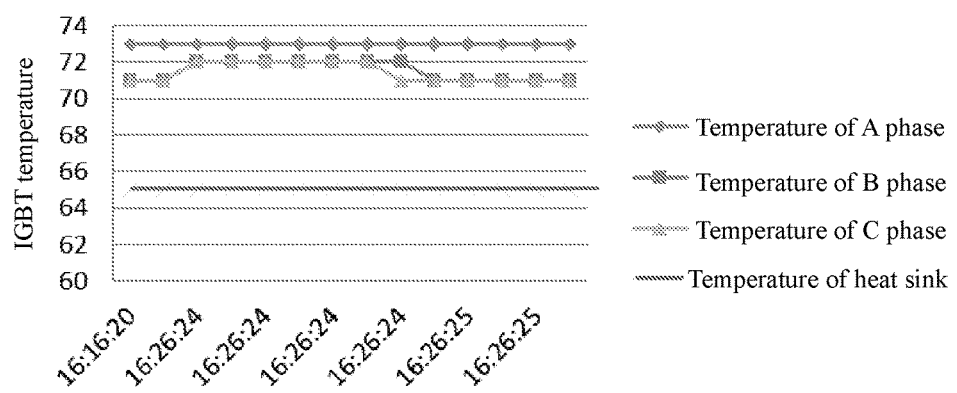
FIG. 7 is a chart of test data of maximum temperatures of an IGBT module having a base plate for a heat sink according to an embodiment of the present invention.

FIG. 7 shows a chart of test data of maximum temperatures of an IGBT module having a base plate 100 for a heat sink according to an embodiment of the present invention, in which the base plate 100 is configured as shown in FIG. 1 and FIG. 3, 40000 mm²≤S≤50000 mm², N=368, S1/S2=229.284. As shown in FIG. 7, it can be seen that, in an insulated gate bipolar transistor (IGBT) which uses the base plate 100 according to embodiments of the present invention, maximum temperatures of A phrase, B phrase and C phrase of the IGBT having the base plate 100 meet actual heat dissipation requirements of IGBT.

The N pins 20 disposed on the first surface layer 11 may be arranged in various manners, and a specific arrangement of the N pins 20 will be provided in the following. The N pins 20 may be arranged in multiple lines, and the multiple lines of pins 20 are spaced apart from one another along a length direction (i.e. a front and rear direction as shown in FIG. 3) of the base plate 100. The multiple lines of pins 20 comprise a first line d1 of pins and a second line d2 of pins, and the first line d1 of pins and the second line d2 of pins are disposed alternately along the length direction of the base plate 100. The first line d1 of pins and the second line d2 of pins both comprise multiple pins 20 spaced apart from one another along a width direction (i.e., a left and right direction as shown in FIG. 3) of the base plate 100. It can be understood that, the first line d1 of pins and the second line d2 of pins, which are disposed alternately, allow the N pins 20 to be arranged reasonably on the first surface layer 11, such that an ability of the pins 20 exchanging heat with the coolant can be ensured. Furthermore, the amount of the pins 20 in the first line d1 and the amount of the pins 20 in the second line d2 both can be adjusted according to the actual situation.

A heat sink according to embodiments of the present invention comprises the base plate 100 according to above embodiments. Since the amount of pins 20 of the base plate 100 is designed reasonably, and the area S1 of the first portion of the first surface layer 11 contacting the coolant and the area S2 of the second portion of the first surface layer 11 contacting the single pin are designed reasonably, the amount of the pins 20 can be effectively reduced while ensuring the heat dissipation ability of the base plate 100, such that the technological requirement of processing the base plate 100 is decreased, the demoulding difficulty of the base plate 100 is reduced, and the qualified-product rate of the base plate 100 is improved, thus reducing the producing difficulty and the producing cost of the base plate 100.

An IGBT module according to embodiments of the present invention comprises the base plate 100 according to above embodiments. Since the amount of pins 20 of the base plate 100 is designed reasonably, and the area S1 of the first portion of the first surface layer 11 contacting the coolant and the area S2 of the second portion of the first surface layer 11 contacting the single pin are designed reasonably, the amount of the pins 20 can be effectively reduced while ensuring the heat dissipation ability of the base plate 100, such that the technological requirement of processing the base plate 100 is decreased, the demoulding difficulty of the base plate 100 is reduced, and the qualified-product rate of the base plate 100 is improved, thus reducing the producing difficulty and the producing cost of the base plate 100.

Reference throughout this specification to "an embodiment", "some embodiments", "one embodiment", "another example", "an example", "a specific examples" or "some examples" means that a particular feature, structure, material, or characteristic described in connection with the embodiment or example is included in at least one embodiment or example of the present invention. Thus, the appearances of the phrases such as "in some embodiments", "in one embodiment", "in an embodiment", "in another example", "in an example", "in a specific examples" or "in some examples" in various places throughout this specification are not necessarily referring to the same embodiment or example of the present invention. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present invention, and changes, alternatives, and modifications can be made in the embodiments without departing from spirit, principles and scope of the present invention.

What is claimed is:

1. A base plate for a heat sink, comprising:
   a base plate body, comprising
      a body part; and
      a first surface layer and a second surface layer disposed respectively on two opposing surfaces of the body part, the second surface layer being configured to be mounted with an electrical component; and
   N pins disposed on the first surface layer and spaced apart from one another, each pin having a first end fixed on the first surface layer and a second end configured as a free end,
   wherein the first surface layer and the N pins are configured to contact a coolant, an area of a first portion of the first surface layer contacting the coolant is denoted as S1, and an area of a second portion of the first surface layer contacting each pin is denoted as S2, in which $180 \leq S1/S2 \leq 800$, and $300 \leq N < 650$.

2. The base plate according to claim 1, wherein $200 \leq S1/S2 \leq 500$, and $300 \leq N < 420$.

3. The base plate according to claim 1, wherein a heat-dissipating area of the base plate is denoted as S, a total area of outer surfaces of circumferential walls of the N pins is denoted as S3, a total area of end surfaces of the free ends of the N pins is denoted as S4, wherein $S = S1 + S3 + S4$, and $40000 \text{ mm}^2 \leq S \leq 50000 \text{ mm}^2$.

4. The base plate according to claim 3, wherein a heat-dissipating area of each pin is denoted as $(S3+S4)/N$, and $80 \text{ mm}^2 \leq (S3+S4)/N \leq 120 \text{ mm}^2$.

5. The base plate according to claim 3, wherein $40000 \text{ mm}^2 \leq S \leq 50000 \text{ mm}^2$, $N=368$, and $S1/S2=229.284$.

6. The base plate according to claim 1, wherein a height of each pin is denoted as h, and $7.5 \text{ mm} \leq h < 8.2 \text{ mm}$.

7. The base plate according to claim 1, wherein a cross sectional area of each pin gradually decreases from the first end thereof to the second end thereof.

8. The base plate according to claim 7, wherein a cross section of each pin is circular, a ratio of a radius of the first end of each pin to a radius of the second end of each pin is $\alpha$, and $1.2 \leq \alpha \leq 1.8$.

9. The base plate according to claim 1, wherein the coolant is contained in a cooling tank, the cooling tank is configured to contact the first surface layer, and a minimum distance from the free ends of the N pins to a bottom wall of the cooling tank is denoted as L1, and $0.2 \text{ mm} \leq L1 \leq 2 \text{ mm}$.

10. The base plate according to claim 1, wherein a distance between two adjacent pins is denoted as L2, and $0.4 \text{ mm} \leq L2 \leq 1.1 \text{ mm}$.

11. The base plate according to claim 10, wherein any two adjacent pins form a group, and the distance L2 in a group of pins is different from the distance L2 in another group of pins.

12. The base plate according to claim 11, wherein $N=368$, and the distance L2 in a first group of pins is 0.62 mm, the distance L2 in a second group of pins is 1.04 mm, and the distances L2 in rest groups of pins satisfy a following condition: $0.62 \text{ mm} \leq L2 \leq 1.04 \text{ mm}$.

13. The base plate according to claim 1, wherein a draft angle β of each pin ranges from 2° to 4°.

14. The base plate according to claim 1, wherein the body part, the first surface layer, the second surface layer and the pins are molded integrally through a pressure infiltration die-casting.

15. The base plate according to claim 1, wherein the body part is made of AlSiC composite materials in which a volume fraction of SiC is 60%-70%.

16. The base plate according to claim 15, wherein each pin is made of aluminum or aluminum alloy, and both the first surface layer and the second surface layer are aluminum layers or aluminum alloy layers.

17. The base plate according to claim 1, wherein the N pins are arranged in multiple lines, the multiple lines of pins are spaced apart from one another along a length direction of the base plate; and the multiple lines of pins comprise a first line of pins and a second line of pins, the first line of pins and the second line of pins are disposed alternately along the length direction of the base plate, the first line of pins and the second line of pins both comprise multiple pins spaced apart from one another along a width direction of the base plate.

18. A heat sink, comprising a base plate for a heat sink according to claim 1.

19. An IGBT module, comprising a base plate for a heat sink according to claim 1.

* * * * *